United States Patent
Albrecht et al.

[11] Patent Number: 5,813,595
[45] Date of Patent: Sep. 29, 1998

[54] METHOD FOR WAVE-SOLDERING PRINTED CIRCUIT BOARDS

[75] Inventors: Hans-Jürgen Albrecht; Günter-Werner Strick, both of Berlin, Germany

[73] Assignee: Siemens Aktiengesellschaft, Munich, Germany

[21] Appl. No.: 737,183

[22] PCT Filed: Mar. 22, 1995

[86] PCT No.: PCT/DE95/00441

§ 371 Date: Mar. 7, 1997

§ 102(e) Date: Mar. 7, 1997

[87] PCT Pub. No.: WO95/30509

PCT Pub. Date: Nov. 16, 1995

[30] Foreign Application Priority Data

May 6, 1994 [DE] Germany .......................... 44 16 788.1

[51] Int. Cl.⁶ ................................................. H05K 3/34
[52] U.S. Cl. ............................. 228/200; 228/37; 228/46; 228/260
[58] Field of Search .................. 228/46, 200, 222, 228/37, 260

[56] References Cited

U.S. PATENT DOCUMENTS

| | | | |
|---|---|---|---|
| 3,605,244 | 9/1971 | Osborne et al. | 228/260 |
| 5,388,752 | 2/1995 | Kawakatsu | 228/37 |
| 5,685,475 | 11/1997 | Jairazbhoy et al. | 228/46 |

FOREIGN PATENT DOCUMENTS

| | | |
|---|---|---|
| 0 365 977 A1 | 5/1990 | European Pat. Off. . |
| 36 11 180 C1 | 1/1987 | Germany . |
| 28 52 132 C2 | 8/1989 | Germany . |
| 38 43 191 C1 | 3/1990 | Germany . |
| 2041809 | 9/1980 | United Kingdom ............ 228/37 |

OTHER PUBLICATIONS

Buch von R. J. Klein–Wassink "Weichlöten in der Electronik," [Soft Soldering in Electronics] 1991, pp. 508–510.

*Primary Examiner*—Patrick Ryan
*Assistant Examiner*—Jeffrey T. Knapp
*Attorney, Agent, or Firm*—Kenyon & Kenyon

[57] ABSTRACT

A method is provided for wave-soldering printed circuit boards. In order to obtain wave-soldered printed circuit boards with smallest possible number of solder globules, after the passage on the wave of solder, the printed circuit boards are further artificially cooled at an approximately constant time-temperature gradient of 20 K/sec.

6 Claims, 2 Drawing Sheets

METHOD FOR WAVE-SOLDERING PRINTED CIRCUIT BOARDS

FIELD OF THE INVENTION

The present invention concerns a method for wave-soldering printed circuit boards in which the printed circuit boards are artificially cooled after passing through the solder wave.

BACKGROUND OF THE INVENTION

A method of this kind is disclosed in German Patent Specification DE 36 11 180 C1, in which an apparatus is described for cooling soldering workpiece carriers and soldered materials in soldering facilities by means of delivery of cool air. In the case of the known method, the printed circuit boards are cooled on their underside, after passing through the solder wave, with air from nozzles that are arranged on either side of the transport path. Smooth and also rapid cooling is thereby achieved, so that when cleaning subsequently occurs almost no cleaning agent evaporates; flux residues also essentially do not evaporate further.

It is moreover commonly known among those skilled in the art of wave-soldering printed circuit boards that solder globules settle onto the printed circuit boards during soldering; these are undesirable since they can lead to serious malfunctions in electrical or electronic devices equipped with printed circuit boards of this kind.

Attempts have therefore already been made to prevent the formation of solder globules early on, during wave-soldering the printed circuit boards themselves, by using special solder resists; however, modification of solder resists in order to eliminate solder globules on printed circuit boards is possible only to a limited extent, since the solder resists must retain the ability to adhere to the copper coatings of the printed circuit board. It is therefore not possible to manufacture solder resists that completely eliminate adhesion of solder.

At present, therefore, it is accepted that solder globules will settle onto printed circuit boards during wave-soldering of the printed circuit boards. Since these solder globules must not, however, remain on the printed circuit boards during assembly into an electrical or electronic device, the printed circuit boards are mechanically brushed off on the soldered side in a production step subsequent to wave-soldering. To this end, defined brush arrangements with specific brush materials are required, in order not only to reliably remove the adhesively attached solder globules from the solder resist on the printed circuit boards, but also to prevent damage to the printed circuit boards during this operation. The brushed printed circuit boards must then be subjected to a visual inspection to ensure that ultimately, only printed circuit boards that are free of solder globules are used.

OBJECTS AND SUMMARY OF THE INVENTION

It is an object of the present invention to provide a method for wave-soldering printed circuit boards with which printed circuit boards free of solder globules can be manufactured.

According to the invention, to achieve this object in a method of the kind indicated initially, cooling of the particular printed circuit board to room temperature, achieving differential contraction of a solder resist mask usually located on the printed circuit board and of the solder applied onto the printed circuit board, occurs with an approximately constant temperature gradient of approximately 20 K/sec. In the method according to the invention, the wave-soldered printed circuit boards are therefore artificially cooled with the indicated temperature gradient after passing through the solder wave, which impedes the adhesion of solder globules onto the soldered side of the printed circuit boards.

The invention is based on recognition of the following correlations:

During wave-soldering of, in particular, mixed-population printed circuit boards, i.e. printed circuit boards that are populated with SMD (surface-mounted device) components and components equipped with connecting wires, the flow characteristics of the solder wave are substantially disturbed by the components and their connections. This causes the homogeneous solder wave to be separated by the flow impediments as it passes along the printed circuit boards. The resulting separated solder volumes are now particularly exposed to the oxidizing solder atmosphere. Mixed tin-lead oxides are produced, which constitute solids and cover the individual separated solder volumes. Because of the reduction in surface tension, they are particularly likely to become adhesively attached onto the solder resist mask of the printed circuit boards as solder globules. Solder resists consist, among other things, of inorganic fillers with polar properties, and have surface tension values that are close to the surface tension values of tin-lead oxides. Relatively high adhesion forces therefore occur at the interfaces between the solder resist and the tin-lead oxides, and lead to adhesion of the solder globules.

The solder volumes that are separated by the flow impediments after passage of the solder wave are thermally at the level of the solder wave, and form oxidized tin-lead particles of spherical shape. The thermal energy input during wave-soldering not only creates the joint between the solder and the parts of the printed circuit board to be soldered, but also leads to a substantial three-dimensional change in the solder resist mask on the printed circuit boards. In a lower temperature range the expansion of the solder resist mask is approximately 60 to 80 ppm/K, and is considerably greater in the solder wave temperature range; the expansion of Sn60Pb40 solder, on the other hand, is 23 ppm/K. The invention thus exploits the different thermal expansion values of the solder resist mask and the tin-lead solder by diminishing the adhesion surfaces between the solder resist and the solder by means of an additional artificial cooling. The differential contraction of the solder resist mask and of the solder is exploited here in order to reversibly disrupt the adhesion surfaces formed between the solder resist and solder during passage of the solder wave; in other words, a thermomechanical mismatch between the solder resist mask and solder is deliberately produced by the additional artificial cooling, in order to reduce adhesion forces.

In the method according to the invention, the additional artificial cooling of the printed circuit boards after passing through the solder wave can occur in various ways, for example with a cooling chamber through which the wave-soldered printed circuit boards pass. The method according to the invention can, however, be performed particularly easily in terms of production engineering and with relatively little outlay if a gas flow, having a temperature which causes cooling with a temperature gradient of approximately 20 K/sec, is directed onto the region of the zone where the solder wave breaks away from the particular printed circuit board.

It is already known from DE Unexamined Application 28 52 132 A1 to direct a gas flow, which can contain air or an inert gas, against the underside of the particular printed circuit board after the solder has been applied onto the circuit board, but here the gas flow is intended to impede the formation of solder short-circuits, drips, and bridges. To achieve this satisfactorily in the case of the known method, factors such as the flow velocity, pressure, and temperature of the gas flow must be adjusted to the particular conditions, which include the size of and packing density on the printed circuit board. Since with the known method the excess solder is blown away before the solder has solidified, a gas flow with preheated air is preferably used; consideration is also given, however, to the use of a gas at ambient temperature.

It is moreover known, from the book "Weichlöten in der Elektronik" [Soft soldering in electronics] by R. J. Klein-Wassink, 1991, pp. 508 to 510, to direct a gas flow onto a wave-soldered printed circuit board immediately after wave-soldering. This is a hot-air flow whose purpose is to remove undesirable solder bridges between conductor paths in order to achieve good solder joints. This hot-air flow, however, causes additional solder globules, which must be removed by washing after soldering.

Particularly good operating results can be obtained with the method according to the invention if an inert gas, which can preferably be nitrogen, is used as the gas for the gas flow. The inert gas creates, in the region where the printed circuit board emerges from the solder wave, a largely oxidation-free atmosphere which decreases the aforementioned oxidation of tin-lead particles due to the separation, thus helping to diminish solder adhesion on the solder resist.

It is also known, from the book by Klein-Wassink mentioned above, page 508, to perform wave-soldering in an inert gas atmosphere with very low oxygen concentrations, but here the entire wave-soldering process occurs in an inert gas atmosphere, and additional artificial cooling is not undertaken. This leads to the creation of comparatively many solder globules.

The method according to the invention can be performed in soldering facilities of various designs. It is considered particularly advantageous, in terms of the manufacturing costs of a soldering facility for performing the method according to the invention, if a soldering facility for wave-soldering printed circuit boards, having a soldering device and a cooling device for printed circuit boards arranged after the soldering device in the transport direction of the printed circuit boards, is used, in which according to the invention, an additional cooling device for the printed circuit board, which effects cooling with the approximately constant temperature gradient of 20 K/sec, is arranged after the solder wave generated by the soldering device in the transport direction of the printed circuit boards. This additional cooling device can be configured in various ways.

It is considered particularly advantageous in terms of manufacturing costs if the cooling device is a rod-shaped nozzle, extending transverse to the transport direction of the printed circuit boards, from which the gas flow is directed onto the particular printed circuit board after passing through the solder wave.

DETAILED DESCRIPTION

Figure 1:
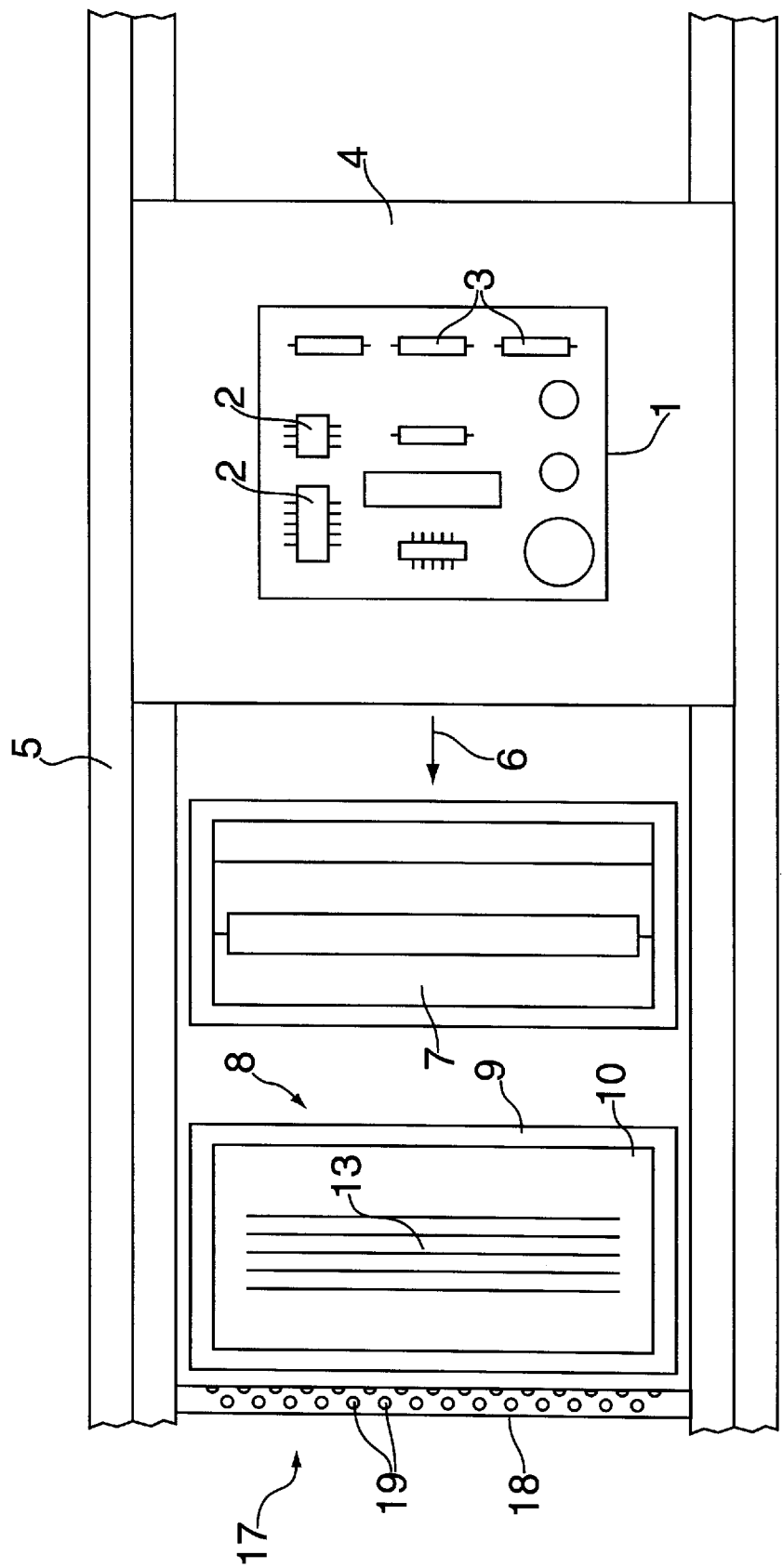
FIG. 1 is a plan view of the part of a soldering facility of interest in connection with the invention, for performing the method according to the invention.

As shown in FIG. 1, a printed circuit board 1 to be soldered, having SMD components 2 and components 3 with connecting wires, is located in a transport frame 4 that can be moved on a transport device 5 in the direction of arrow 6. In the position depicted, the transport frame is located just before a wetting device 7 in which, as printed circuit board 1 moves over it, flux is applied onto the lower (in FIG. 1) soldered side of printed circuit board 1.

Before the printed circuit board is placed into transport frame 4, it is not only populated with components 2 and 3, but also usually equipped with copper conductor paths and covered with a solder resist on the lower (in FIG. 1) side at those points to which solder is not intended to adhere to printed circuit board 1 or to components 2 and 3.

Once transport frame 4, with printed circuit board 1 to be soldered, has passed over wetting device 7, it arrives in the region of a soldering device 8 which contains a container 9, depicted only schematically in FIG. 1, of liquid tin-lead solder 10. This solder—as is more clearly evident from FIG. 2—is pumped upward by means of a pump (not depicted) in a delivery channel 11 in the direction of arrow 12, and thus forms a solder wave 13. Transport device 5 is aligned with respect to solder wave 13 in such a way that printed circuit board 1 to be soldered—as FIG. 2 once again clearly shows—passes through wave 13 so that soldering occurs.

Figure 2:
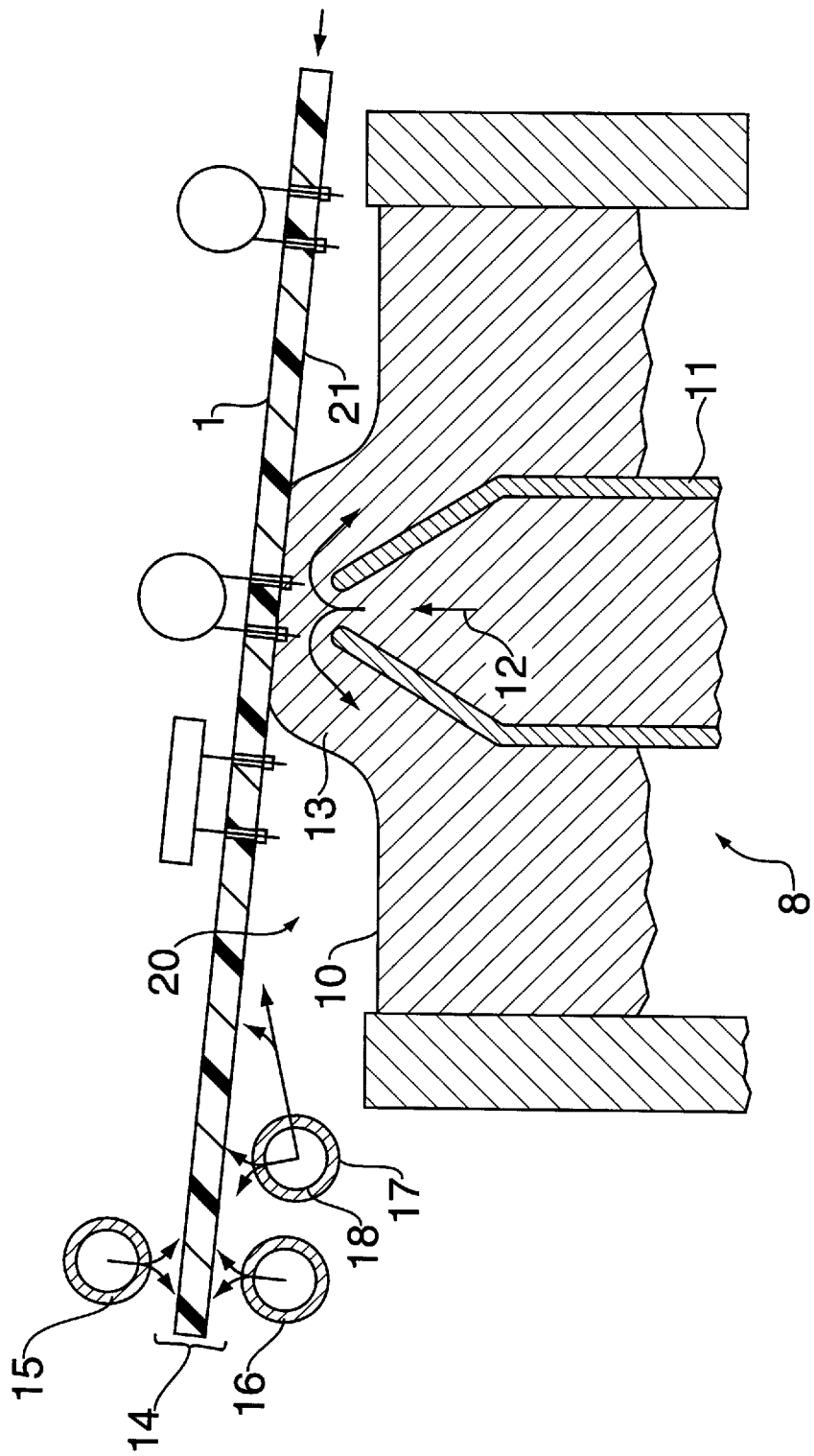
FIG. 2 is a side cross-section view of a section of FIG. 1.

Located after soldering device 8 in the transport direction (arrow 6) is not only a first cooling device 14 with nozzles 15 and 16, but also an additional cooling device 17 that is again depicted only schematically in FIGS. 1 and 2. Additional cooling device 17 contains substantially a rod-shaped nozzle 18 that is equipped with individual outlet openings 19 for a flow of inert gas. The orientation of nozzle 18 and its openings is such that the inert gas, preferably nitrogen, is blown into region 20 behind solder wave 13 against printed circuit board 1. The nitrogen is at a temperature no more than room temperature, so the gas flow results in an additional artificial cooling of printed circuit board 1 after passing through solder wave 13. When cooling occurs with a time/temperature gradient of approximately 20 K/sec, printed circuit boards are produced that have essentially no further solder globules on soldered side 21.

Rod-shaped nozzle 18 can be arranged rotatably about its longitudinal axis, so the additional cooling system can be adapted to different printed circuit board heat capacities.

We claim:

1. A method for wave-soldering a printed circuit board, said printed circuit board including a solder resist mask thereon, comprising the steps of:

passing the printed circuit board through a solder wave to apply solder thereon;

artificially cooling the printed circuit board after passing it through the solder wave to cool the printed circuit board to room temperature to achieve differential contraction of the solder resist mask and of the solder applied onto the printed circuit board with an approximately constant temperature gradient of approximately 20 K/sec.

2. The method of claim 1, wherein a gas flow, having a temperature such that cooling occurs with the approximately constant temperature gradient of 20 K/sec, is directed onto the region of the printed circuit board emerging from the solder wave.

3. The method of claim 2, wherein the gas is an inert gas.

4. The method of claim 3, wherein the inert gas is nitrogen.

5. A soldering facility for wave-soldering printed circuit boards, comprising:

a soldering device for generating a solder wave to apply solder to the circuit boards;

a cooling device for cooling the printed circuit boards arranged after the soldering device in the transport direction of the printed circuit boards; and an additional cooling device for the printed circuit boards for cooling the printed circuit boards at an approximately constant temperature gradient of 20 K/sec arranged after the solder wave generated by the soldering device in the transport direction of the printed circuit boards.

6. The soldering facility of claim 5, wherein the additional cooling device comprises a rod-shaped nozzle extending transverse to the transport direction of the printed circuit boards.

* * * * *